US005828760A

United States Patent [19]

Jacobson et al.

[11] Patent Number: 5,828,760

[45] Date of Patent: Oct. 27, 1998

[54] NON-LINEAR REDUCED-PHASE FILTERS FOR ACTIVE NOISE CONTROL

[75] Inventors: Clas A. Jacobson, Tolland; Duane C. McCormick, Colchester, both of Conn.

[73] Assignee: United Technologies Corporation, Hartford, Conn.

[21] Appl. No.: 672,168

[22] Filed: Jun. 26, 1996

[51] Int. Cl.[6] .................................................. H03B 29/00

[52] U.S. Cl. .................................... 381/71.11; 381/71.12

[58] Field of Search ............................. 381/71.11, 71.12, 381/71.14, 94.1, 94.2, 84.3, 73.1, 71.13, 71.5, 71.1, 71.8, 71.9; 364/724.19

[56] References Cited

U.S. PATENT DOCUMENTS

| | | | |
|---|---|---|---|
| 4,625,083 | 11/1986 | Poikela | 381/71.13 |
| 4,947,434 | 8/1990 | Ito | 381/71.13 |
| 5,010,576 | 4/1991 | Hill | 381/71.14 |

FOREIGN PATENT DOCUMENTS

| | | |
|---|---|---|
| 42 29 436 A1 | 3/1993 | Germany . |
| 2 282 933 | 4/1995 | United Kingdom . |

OTHER PUBLICATIONS

International Search Report for PCT/US97/08132, mailed Sep. 19, 1997; for the PCT application that corresponds to United States Application 08/672.168.

Hu, Jwu–Sheng, "Active Noise Cancellation in Ducts Using Internal Model–Based Control Algorithms." *IEEE Transactions on Control Systems Technology*, vol. 4, No. 2, 1 mar. 1996, pp. 163–170.

Hong, Jeongho et al., "Modeling, Indentification, and feedback control of Noise in an Acoustic Duct." *IEEE Transactions on Control Systems Technology*, vol. 4, No. 3, May 1996, pp. 283–291.

Arthur Gelb et al, "Multiple–Input Describing Functions and Nonlinear Systems Design," McGraw–Hill Book Company, 1968, pp. 79–81.

Isaac Horowitz et al., "Non–linear design for cost of feedback reduction in systems with large parameter uncertainty." Int. J. Control, 1975, vol. 21, No. 6, pp. 977–1001.

*Primary Examiner*—Vivian Chang
*Attorney, Agent, or Firm*—Gerald L. DePardo

[57] ABSTRACT

An active noise (or vibration) control system having an actuator 24 which provides an acoustic anti-noise signal in response to an drive signal (U), an error sensor 16 which senses the acoustic anti-noise signal from the actuator, senses disturbance noise (d), and provides an error signal (e) indicative of a combination thereof, and a controller 20, responsive to the error signal (e), which provides the drive signal (U) to the actuator 24, is provided with controller compensation 78 having energy states 112 and having non-linear reset logic 130 which temporarily resets the energy states 112 in the filter 78 to zero when the error signal crosses zero, thereby improving the bandwidth of the active noise control system.

18 Claims, 3 Drawing Sheets

NON-LINEAR REDUCED-PHASE FILTERS FOR ACTIVE NOISE CONTROL

TECHNICAL FIELD

This invention relates to active noise (or vibration) control and more particularly to the use of non-linear reduced phase filters in active noise (or vibration) control systems.

BACKGROUND ART

It is known in the art of active noise (or vibration) control (ANC) systems, that such systems are used to electronically sense and cancel undesired noise (or vibration) from noise producing sources such as fans, blowers, electronic transformers, engines, etc. One methodology for sensing and cancellation involves a "collocated" approach where a sensor (such as a microphone) and an actuator (such as a speaker) are located along the same plane as the wave-front plane of the disturbance noise (or vibration).

A known "collocated" active noise control system for an HVAC (Heating, Ventilating, and Air Conditioning) duct, consists of a speaker which injects acoustic waves (or "anti-noise") into the duct which are out-of-phase with the aforementioned noise waves so as to cancel the noise waves near the output of the speaker, and an error microphone (mic) located in the plane of sound waves from the speaker, which senses the amount of cancellation of the noise. Signals from the error microphone are fed to active noise control electronic circuitry and/or software and provides an electrical drive signal to drive the speaker which provides the "anti-noise" acoustic signal so as to minimize the error noise signal. As used herein, the term "anti-noise" is used to represent the noise-cancelling signal produced by the speaker.

In an ideal collocated system, the closed loop transfer function (from disturbance noise in to anti-noise at the error mic out) would be equal to −1 (or a pressure release condition). To achieve this −1 limit, high loop gain (or controller gain) is needed.

However, the time delay for the acoustic anti-noise signal to travel from the speaker to the error mic (as well as time delays within the speaker) causes a pure time delay ($e^{-sT}$) to exist in the control loop. Known linear control theory and Bode gain-phase relations establish limits on the performance-stability tradeoffs of a linear control system with a time delay in the loop. In particular, to prevent instabilities in the control system, the loop gain must be decreased in the region where the phase lag increases rapidly due to the time delay. Such a reduced loop gain results in lower bandwidth and slower time response thereby limiting the performance and feasibility of such a collocated design approach.

Thus, it would be desirable to develop a collocated duct active noise control system which allows high loop gain while maintaining sufficient stability margin in the presence of a time delay to provide stable control of the loop.

DISCLOSURE OF INVENTION

Objects of the present invention include provision of a collocated duct active noise control system having a high loop gain and thus improved noise cancellation.

According to the present invention an active noise (or vibration) control system comprises an actuator which provides an acoustic anti-noise signal in response to a drive signal; an error sensor disposed so as to sense the acoustic anti-noise signal from the actuator and to sense disturbance noise and provide an error signal indicative of a combination thereof; a controller responsive to the error signal, comprising a filter having energy states, and nonlinear reset logic which temporarily resets the energy states in the filter to zero when the error signal crosses zero; the controller providing the drive signal to the actuator; and the acoustic anti-noise signal having an amplitude and phase so as to attenuate the disturbance noise at the sensor.

According further to the present invention, the filter is a first order low pass (lag) filter. According still further to the present invention, the filter is a discretized filter. Still further accord to the present invention, the non-linear reset logic resets the energy states to zero for one sample time.

The invention represents a significant improvement over the prior art by providing a reduced phase shift non-linear filter having a reset element for active noise (or vibration) control applications. Such a filter has a first harmonic magnitude frequency response profile substantially similar to that of an analogous linear filter (e.g., similar dB/decade profile beyond the break frequency), but has a first harmonic phase frequency response which exhibits less phase lag than the associated linear filter. Accordingly, the invention allows a collocated active noise control system (which has a pure time delay phase lag) to be implemented with increased gain and bandwidth and thus acceptable noise cancellation performance.

The foregoing and other objects, features and advantages of the present invention will become more apparent in light of the following detailed description of exemplary embodiments thereof as illustrated in the accompanying drawings.

BEST MODE FOR CARRYING OUT THE INVENTION

Figure 1:
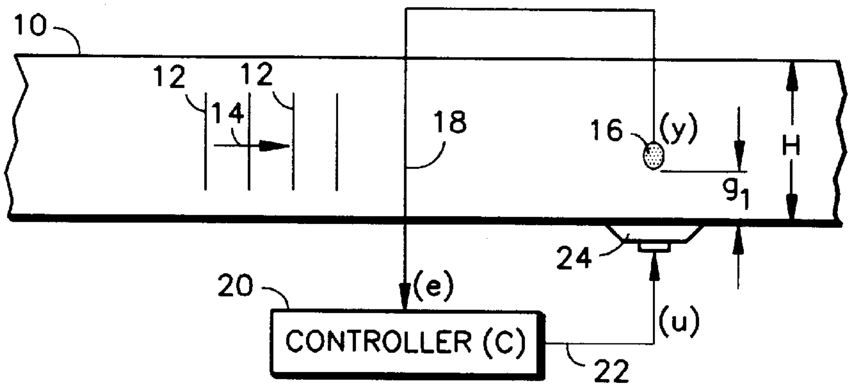
FIG. 1 is a schematic block diagram of a collocated duct active noise control system in accordance with the present invention.

Referring to FIG. 1, a collocated active noise control system for an HVAC duct comprises a duct 10 along which acoustic disturbance noise waves 12 (d) (shown as wave-front lines) propagate in a direction 14. An error microphone 16 detects the noise waves 12 and provides an electrical signal (e) on a line 18 to an active noise control (ANC) controller 20. Instead of a microphone, any acoustic measurement device may be used if desired. The controller 20 provides an electrical drive signal (U) on a line 22 to a speaker 24, e.g., an 8" diameter circular speaker by JB Lancing, Model No. JBL 2118H, mounted to a wall of the duct 10. Other speakers may be used if desired. Instead of a speaker any acoustic actuator may be used if desired, e.g., a non-voice coil film actuator, e.g., PVDF, voided PVDF, electrostatic, piezo-electric, piezopolymer, piezoceramic, etc. The duct 10 is a rectangular duct having a height H of 5 inches (12.7 cm) and a depth (into the page) of 10 inches (25.4 cm). Other duct shapes and dimensions may be used if desired.

The speaker 24 produces out-of-phase acoustic waves or "anti-noise"(not shown) of an appropriate amplitude and phase so as to cancel the noise waves 12. As discussed hereinbefore, the term "anti-noise" is used to represent the noise-cancelling signal produced by the speaker. Any residual noise which is not canceled by the anti-noise from the speaker 24 is sensed by the error microphone 16 and provided to the controller 20 on the line 18 as the electrical error signal (e).

The error microphone 16 is located a predetermined distance $g_1$ away from the acoustic near field effects of the speaker, e.g., 2 inches, from the speaker 24 face (at the duct wall), i.e., where the pressure amplitude and phase of the wave is equal to the plane wave component which emanates from the speaker. Other distances for $g_1$ may be used if desired. The controller 20 adjusts the output signal (U) on the line 22 to the speaker 24 so as to reduce the total acoustic noise at the microphone 16 (and the error signal (e)), and, thus, reduce (or attenuate) the propagating noise in the duct (in a certain frequency range) downstream of the speaker 24.

The controller 20 comprises known electronic circuits and/or software to provide the functions described herein. The details of the controller 20 will be discussed more hereinafter.

Figure 2:
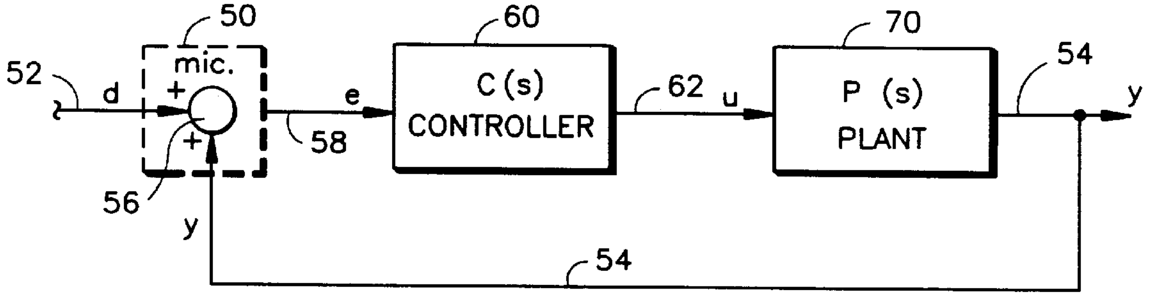
FIG. 2 is a control system block diagram of the collocated system of FIG. 1, in accordance with the present invention.

Referring now to FIG. 2, the mic 16, the controller 20, and the speaker 24 (including the duct dynamics between the speaker 24 and the mic 16) of FIG. 1, are represented by control system blocks 50,60,70, respectively. The error mic block 50 receives the input disturbance noise signal d on a line 52 and an anti-noise signal y on a line 54 (both as independently seen at the error mic 16), sums the signals d,y, as represented by a summer 56, and provides the error signal e on a line 58 indicative of the sum of the noise and anti-noise signals. The error signal e is fed to a controller block 60 having a transfer function C(s) indicative of the controller 20 (FIG. 1) dynamics which provides the signal U on a line 62. The signal U is provided to a plant block 70 having a transfer function P(s) indicative of the plant dynamics which provides the signal y to the mic block 50 on the line 54.

Figure 3:
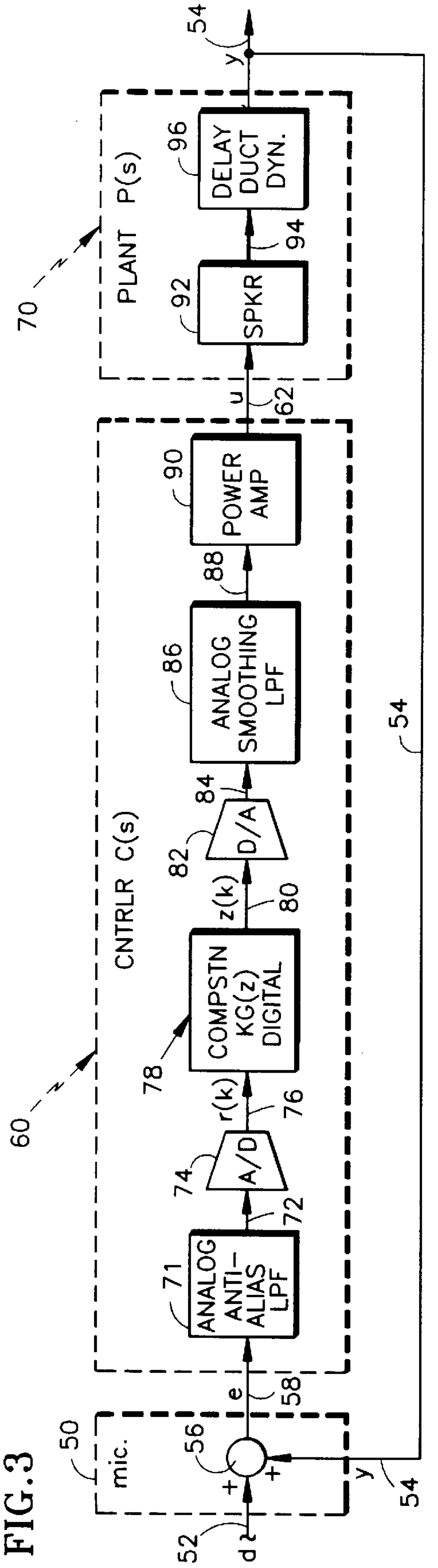
FIG. 3 is a detailed control system block diagram of the collocated system of FIG. 1, in accordance with the present invention.

Referring now to FIG. 3, a more detailed control system block diagram of the controller block 60 and the plant block 70 of FIG. 2 is provided. Within the controller 60 C(s), the signal e on the line 58 from the microphone block 50 is provided to an analog low pass anti-aliasing filter 71 having a break frequency of, e.g., 7K Hz, typically at least half the sample frequency. The low pass filter 71 acts as an anti-aliasing filter to attenuate high frequencies and avoid aliasing of the input signal which can occur in a digital sampled data system as is known. Other break frequencies and/or filter orders may be used if desired depending on the sample rate, the amount of desired attenuation, and amount of phase lag allowable, as is well known.

The low pass filter 71 provides a filtered signal on a line 72 to a known A/D (Analog-to-Digital) converter 74 which converts the analog signal on the line 72 to a sampled digital signal r(k) on a line 76. The signal r(k) is fed to digital control (or compensation or non-linear filter) logic 78, e.g., a microprocessor or digital signal processor, such as a DSP chip Part No. TMS 320C40, having a sample rate of, e.g., 14K Hz. Other sample rates and other microprocessors may be used if desired.

The digital control logic 78 is designed to provide the desired control system response time and bandwidth, thereby providing adequate noise cancellation. In particular, the digital control logic 78 comprises a reduced phase shift digitized filter with reset elements (discussed more hereinafter). The digital control logic 78 provides a digital output signal z(k) on a line 80 to a D/A (Digital-to-Analog) converter 82 which converts the digital signal r(k) to an analog signal on a line 84.

The analog signal on the line 84 is fed to an analog low pass smoothing filter 86 having a break frequency of, e.g., 7K Hz, half the D/A output sample rate. The analog low pass filter 86 acts to smooth the stepped (or quantized) output signal from the D/A converter 82, thereby providing a smooth analog signal. Other break frequencies and/or filter orders may be used if desired depending on the amount of desired smoothing, and amount of phase lag allowable, as is known. The smoothed analog signal on the line 88 is provided to a power amplifier 90 which provides the amplified electronic drive signal U on the line 62. The gain of the power amp 90 and the gain K in the compensation 78 are sized to provide the desired system performance.

The drive signal U on the line 62 is fed to the plant 70 P(s) which comprises a transfer function block 92 representing the dynamics of the speaker 24 (FIG. 1). The speaker block 92 provides the acoustic "anti-noise" signal on a line 94, in response to the drive signal U, which is fed to a block 96 representing the propagation (or pure) time delay of the acoustic speaker signal to the error mic and any additional associated acoustic dynamics of the duct 10. The most dominant dynamic of the block 96 is the pure propagation time delay for the anti-noise signal to travel from the speaker 24 (FIG.1) to the mic 16. When the anti-noise signal reaches the error microphone 16 (FIG. 1) it is indicated by the signal y on the line 54. The anti-noise signal y on the line 54 and the input disturbance signal d on the line 52 are combined at the error mic block 50 and the summer 56 (as discussed hereinbefore).

In an ideal collocated active duct noise control system, the transfer function from the input disturbance d to the anti-noise signal y seen at the microphone 16 (the closed loop transfer function y/d) is equal to −1, i.e., a magnitude of 1 and a phase of 180°. The dynamics around the open loop system of FIG. 3 comprises the anti-aliasing filter 70, the digital control logic 78, the smoothing filter 86 and the time delay in the box 96, all of which comprise the major components of phase contributions to the open loop stability analysis. Of these components, the most significant factor is the pure time delay in the block 96 represented as $e^{-sT}$ where T is the time delay in seconds that it takes for the acoustic wave to propagate the distance $g_1$ from the speaker 24 to the microphone 16 (FIG. 1).

With the pure time delay in the system, the maximum value of the gain in the compensation logic 78 is fixed for standard linear low pass filter compensation to keep the system from exhibiting instabilities.

Figure 4:
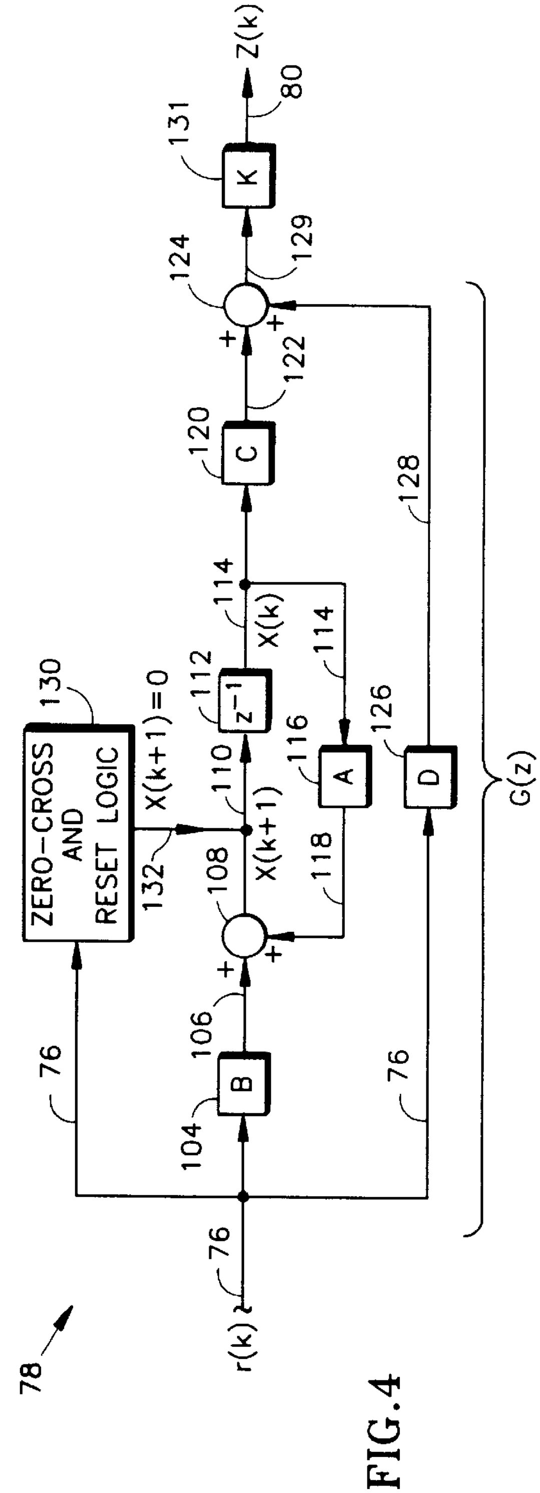
FIG. 4 is a block diagram of digital compensation having a non-linear reset element, in accordance with the present invention.

Referring now to FIG. 4, the digital control logic 78 has the form K*G(z). The input signal r(k) to the compensation logic 78 is fed on the line 76 to digital low pass filter compensation logic G(z) having a non-linear reset element 130, discussed more hereinafter. The low pass filter G(z) is a standard discretized transfer function which is modeled by a discrete state equations of the form:

$$X(k+1)=A*X(k)+B*U(k) \quad \text{[Eq. 1]}$$

$$Y(k)=C*X(k)+D*U(k) \quad \text{[Eq. 2]}$$

where A=0.9718, B=0.0282, C=1.0, and D=0 corresponding to values obtained using a backward integration discretized first order low pass (or lag) digital filter with a break frequency of 100 Hz. Other break frequencies and discretization methods may be used if desired. Also, other values for A,B,C,D may be used, depending on the break frequency and the discretization method used.

The block diagram representation of the above equations Eq. 1 and Eq. 2 is shown in FIG. 4 where the signal r(k) on the line 76 is fed to a gain block (B) 104 which provides a signal on a line 106 to a positive input of a summer 108. The output of the summer is provided on a line 110 to a storage element (or energy state) or sample delay ($z^{-1}$) 112. The output of the storage element 112 is a delayed signal X(k) which is provided on a line 114 and fed through a gain (A) 116 on a line 118 to another positive input of the summer 108. The signal X(k) on the line 114 is also fed to a gain block (C) 120 which provides a gain shifted signal on a line 122 to a positive input of a summer 124.

The input signal r(k) on the line 76 is also provided to a gain block (D) 126 which provides a signal on a line 128 to another positive input of the summer 124. The summer 124 provides a signal on a line 129 indicative of the sum of the signals on the lines 122,128, to a gain multiplier 131 K having a value so as to produce the desired system response. The gain adjusted signal is provided on the line 80 as the output signal Z(k).

Also, the input signal r(k) on the line 76 is provided to zero-crossing and reset logic 130 (or a non-linear reset element) which samples the input signal r(k) and, if the input r(k) has crossed through zero (i.e., changed sign), the logic 130 sets the next state signal X(k+1) on the line 110 to zero for one sample period, as indicated by a line 132.

Figure 5:
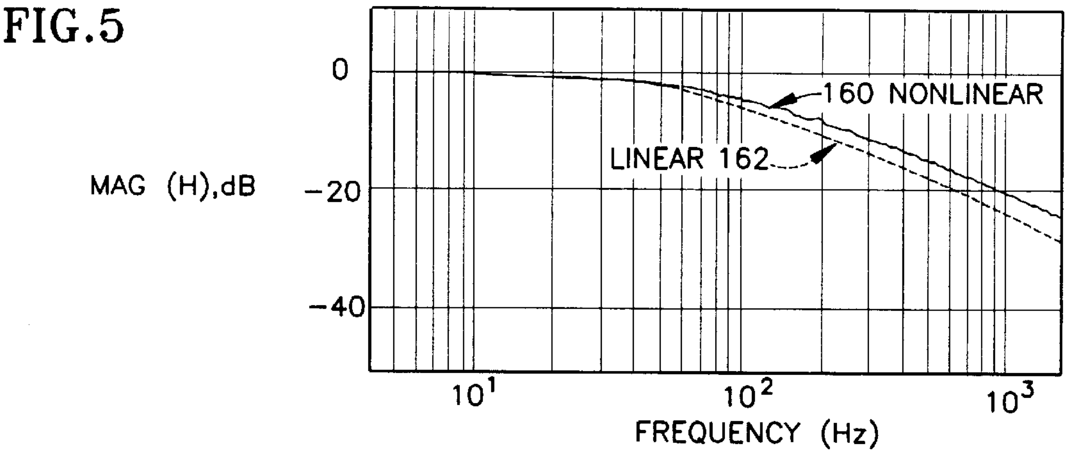
FIG. 5 is a magnitude frequency response plot of prior art linear compensation and nonlinear compensation in accordance with the present invention.

Referring now to FIG. 5, a first harmonic magnitude frequency response of the non-linear filter logic 78 (FIG. 4) of the present invention is indicated by a curve 160, and a magnitude frequency response of the prior art linear version of the same filter logic without the zero-crossing and reset logic 130 is shown by a dashed curve 162. The curves 160,162 exhibit substantially similar magnitude response profiles.

Figure 6:
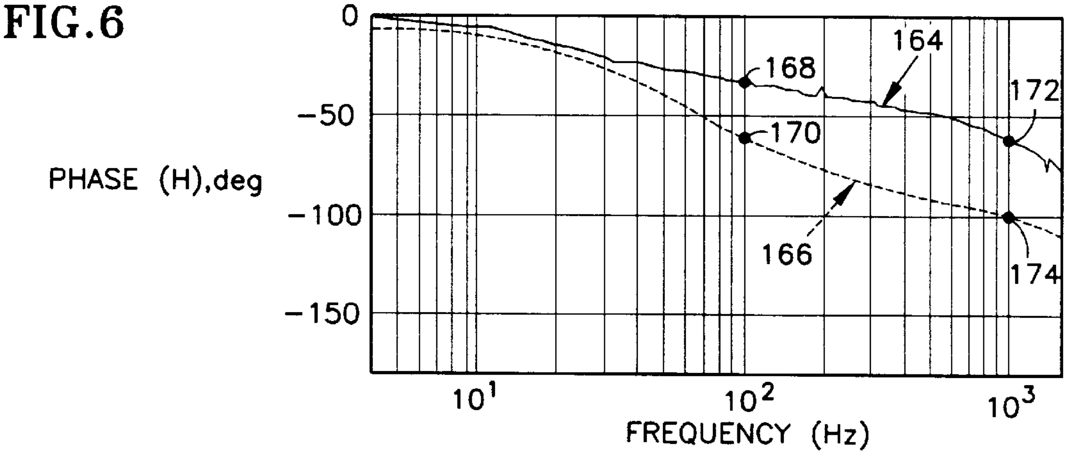
FIG. 6 is a phase frequency response plot of prior art linear compensation and nonlinear compensation in accordance with the present invention.

Referring now to FIG. 6, a first harmonic phase frequency response of the nonlinear filter logic 78 (FIG. 4) of the present invention is indicated by a curve 164, and a phase frequency response for the prior art linear version is shown by a dashed curve 166. The phase response curve 164 of the nonlinear filter is the phase approximation of the first harmonic or describing function and shows significantly less phase lag from that of the linear version. In particular, at the break frequency 100 Hz, the phase of the nonlinear filter is −32 degrees, as indicated by a point 168 on the curve 164, whereas the phase of the linear filter is about −59 degrees as indicated by a point 170 on the curve 166. Also, the phase of the non-linear filter at 1000 Hz is approximately −60 degrees, as indicated by a point 172, whereas the phase of the linear filter is approximately −100 degrees, as indicated by a point 174. It should be understood that the phase lag of the linear filter is 14 degrees more than 45 degrees because of the effects of analog-to-digital conversion (i.e., zero-order hold effect).

Figure 7:
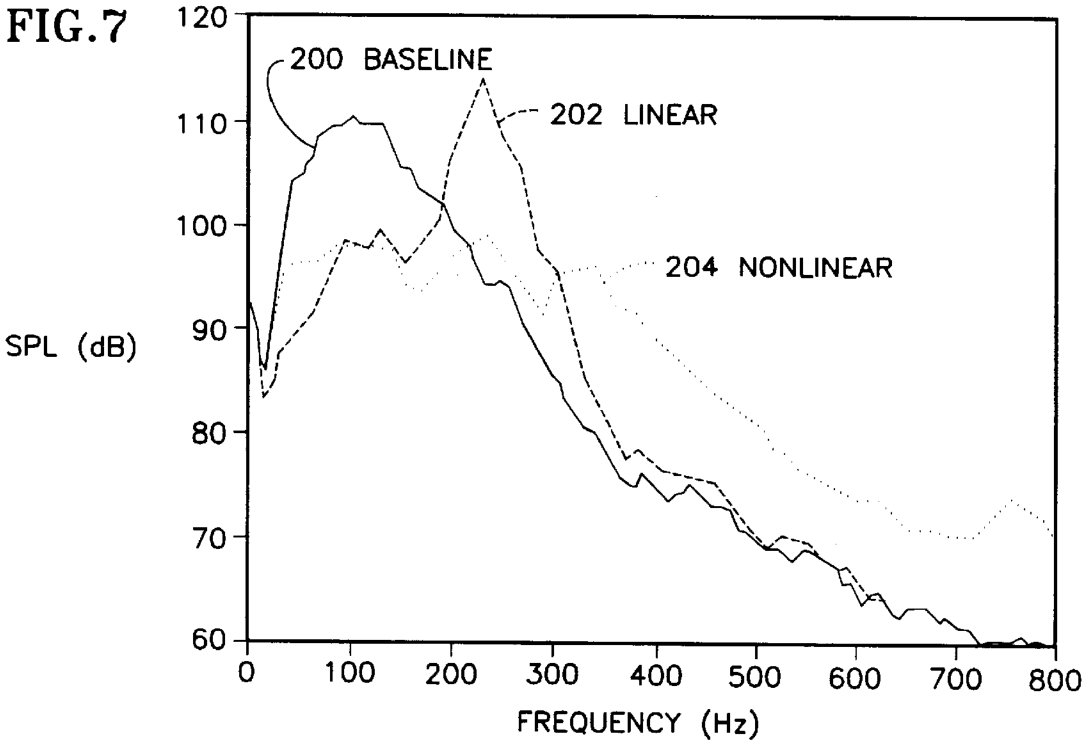
FIG. 7 is a graph of sound pressure level (SPL) versus frequency for no compensation, prior art linear compensation, and nonlinear compensation in accordance with the present invention.

Referring now to FIG. 7, the sound power level (SPL) versus frequency for the system of FIG. 1 is plotted measuring the amount of acoustic noise propagated downstream of the speaker 24 (FIG. 1). Such data of FIG. 7 was measured by a microphone (not shown) located downstream of the speaker away from the near-field effects of the speaker 24 (FIG. 1). In particular, a baseline curve 200 without any noise control compensation indicates a peak noise level of about 110 dB over a frequency range of about 80–150 Hz. If the controller 20 uses typical linear compensation, the response of the system is shown by a curve 202 which indicates a peak response of greater than 110 dB at approximately 280 Hz. However, if the non-linear reduced phase shift filter as described herein is used, the acoustic noise level stays below 100 dB across the entire spectrum as indicated by curve 204. Also, while at high frequencies, e.g., greater than about 350 Hz, there is some noise addition greater than that of the linear filter response 202, it is still at an acceptable noise level.

Thus, using the non-linear filter 78 of FIG. 4 in the collocated control system provides acceptable noise cancellation across the entire frequency range of interest. In particular, it allows the gain K of the control logic 78 to be increased while maintaining adequate stability margin in the system, thereby providing sufficient bandwidth and time response of the closed loop system (y/d) so as to allow the system to respond to the disturbance noise d in adequate time and provide sufficient noise cancellation over a broad frequency range.

It should be understood that while the control logic 78 has been described as being implemented digitally, it should be understood by those skilled in the art that the invention will also work with an analog version of the same filter with zero cross and reset logic. In that case, the input signal would be monitored for zero crossings and when the input crosses zero, all the analog energy storage elements (e.g., capacitors, inductors, etc.) would be set to zero. Also, the zero-crossing and reset logic 130 (FIG. 4) may be implemented in digital or analog logic or in software.

It should be understood that instead of using electrical wires and electrical signals for the signals described herein, the invention will work equally well with optical fibers and optical signals used in place thereof for any portion of the system.

Even though the invention has been described as being used with a collocated active noise control system, it should be understood that the invention may be used with any active noise or vibration control system configuration employing a first order low pass filter where decreased open loop phase lag is desirable to improve performance. Also, as used herein, the terms “noise” and “vibration” may be used interchangeably (taking into account known differences between the analogous active noise control and active vibration control systems).

Although the invention has been described and illustrated with respect to the exemplary embodiments thereof, it should be understood by those skilled in the art that the foregoing and various other changes, omissions and additions may be made without departing from the spirit and scope of the invention.

We claim:

1. An active noise control system, comprising:

an actuator which provides an acoustic anti-noise signal in response to a drive signal;

an error sensor disposed so as to sense said acoustic anti-noise signal from said actuator and to sense disturbance noise and provide an error signal indicative of a combination thereof;

a controller responsive to said error signal, comprising:

a filter having energy states; and non-linear reset logic which temporarily resets said energy states in said filter to zero when said error signal crosses zero;

said controller providing said drive signal to said actuator; and said acoustic anti-noise signal having an amplitude and phase so as to attenuate said disturbance noise at said sensor.

2. The active noise control system of claim 1 wherein said filter is a first order lag filter.

3. The active noise control system of claim 1 wherein said filter is a discretized filter.

4. The active noise control system of claim 3 wherein said non-linear reset logic resets said energy states to zero for one sample time.

5. The active noise control system of claim 1 wherein said actuator comprises a speaker.

6. The active noise control system of claim 1 wherein said sensor comprises a microphone.

7. An active noise control system, comprising:

actuator means for providing an acoustic anti-noise signal in response to a drive signal;

error sensing means for sensing said acoustic anti-noise signal from said actuator means, for sensing disturbance noise, and for providing an error signal indicative of a combination thereof;

signal processing means responsive to said error signal and having energy states, for filtering said error signal and for temporarily resetting said energy states to zero when said error signal crosses zero, and for providing said drive signal to said actuator means; and said acoustic anti-noise signal having an amplitude and phase so as to attenuate said disturbance noise at said sensor.

8. The active noise control system of claim 7 wherein said filtering comprises a first order lag filter function.

9. The active noise control system of claim 7 wherein said filtering comprises a discretized filter function.

10. The active noise control system of claim 9 wherein said resetting resets said energy states to zero for one sample time.

11. The active noise control system of claim 7 wherein said actuator means comprises a speaker.

12. The active noise control system of claim 7 wherein said error sensing means comprises a microphone.

13. A method for reducing noise, comprising:

providing an acoustic anti-noise signal in response to a drive signal;

sensing said acoustic anti-noise signal, sensing disturbance noise, and providing an error signal indicative of a combination thereof;

filtering said error signal and temporarily resetting energy states in said filtering step to zero when said error signal crosses zero, and providing said drive signal; and said acoustic anti-noise signal having an amplitude and phase so as to attenuate said disturbance noise at said sensor.

14. The active noise control system of claim 13 wherein said step of filtering comprises a first order lag filter function.

15. The active noise control system of claim 13 wherein said step of filtering comprises a discretized filter function.

16. The active noise control system of claim 15 wherein said resetting step resets said energy states to zero for one sample time.

17. The active noise control system of claim 13 wherein said step of providing an acoustic anti-noise signal is performed by a speaker.

18. The active noise control system of claim 13 wherein said sensing step is performed by a microphone.

* * * * *